(12) United States Patent
McKenna et al.

(10) Patent No.: US 6,998,625 B1
(45) Date of Patent: Feb. 14, 2006

(54) ION IMPLANTER HAVING TWO-STAGE DECELERATION BEAMLINE

(75) Inventors: Charles M. McKenna, Boxford, MA (US); Nicholas R. White, Wenham, MA (US); Douglas A. Brown, South Hamilton, MA (US); Edward Bell, Newbury, MA (US); Svetlana Radovanov, Marblehead, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 144 days.

(21) Appl. No.: 09/602,059

(22) Filed: Jun. 23, 2000

Related U.S. Application Data (60) Provisional application No. 60/140,466, filed on Jun. 23, 1999.

(51) Int. Cl.
*G21K 5/10* (2006.01)
*H01J 37/08* (2006.01)

(52) U.S. Cl. .............................. 250/492.21; 250/492.2; 250/492.22; 250/492.3

(58) Field of Classification Search ........... 250/492.21, 250/492.3, 492.2, 492.22
See application file for complete search history.

(56) References Cited

U.S. PATENT DOCUMENTS 3,908,183 A    9/1975   Ennis, Jr. ..................... 357/65

(Continued)

FOREIGN PATENT DOCUMENTS

EP    0 451 907    10/1991

(Continued)

OTHER PUBLICATIONS

S.N. Hong et al, "Formation of Ultrashallow P+ -n Junctions by Low-Energy Boron Implantation Using a Modified Ion Implanter, " Appl. Phys. Lett. 53(18), Oct. 31, 1988, pp. 1741-1743.

A. Kluge et al, "A Flexible Target Chamber for a Varian 350 DF Implanter," Nuclear Inst. & Methods in Physics Research B37/38 (1989), pp. 584-587.

T. Kawai et al, "Nissin EXCEED 2000—A New High Performance Medium Current Implanter", Ion Implantation Tech. 94, S. Coffa et al (eds.), 1995 Elsevier Science Publ. B.V., pp. 470-473.

(Continued)

*Primary Examiner*—Frank G. Font
*Assistant Examiner*—Mary El-Shammaa (57) ABSTRACT

An ion implanter includes an ion source for generating an ion beam, an analyzer for separating unwanted components from the ion beam, a first beam transport device for transporting the ion beam through the analyzer at a first transport energy, a first deceleration stage positioned downstream of the analyzer for decelerating the ion beam from the first transport energy to a second transport energy, a beam filter positioned downstream of the first deceleration stage for separating neutral particles from the ion beam, a second beam transport device for transporting the ion beam through the beam filter at the second transport energy, a second deceleration stage positioned downstream of the beam filter for decelerating the ion beam from the second transport energy to a final energy, and a target site for supporting a target for ion implantation. The ion beam is delivered to the target site at the final energy. In a double deceleration mode, the second transport energy is greater than the final energy for highest current at low energy. In an enhanced drift mode, the second transport energy is equal to the final energy for highest beam purity at low energy.

57 Claims, 6 Drawing Sheets

U.S. PATENT DOCUMENTS

| | | | |
|---|---|---|---|
| 4,011,449 A | 3/1977 | Ko et al. | 250/492.21 |
| 4,276,477 A | 6/1981 | Enge | 250/398 |
| 4,283,631 A | 8/1981 | Turner | 250/492 B |
| 4,899,059 A | 2/1990 | Freytsis et al. | 250/492.2 |
| 4,922,106 A | 5/1990 | Berrian et al. | 250/492.2 |
| 5,091,655 A | 2/1992 | Dykstra et al. | 250/492.2 |
| 5,126,575 A | 6/1992 | White | 250/492.3 |
| 5,177,366 A | 1/1993 | King et al. | 250/492.2 |
| 5,343,047 A | 8/1994 | Ono et al. | 250/251 |
| 5,350,926 A | 9/1994 | White et al. | 250/492.21 |
| 5,393,985 A | 2/1995 | Yamakage et al. | 250/492.21 |
| 5,399,871 A | 3/1995 | Ito et al. | 250/251 |
| 5,747,936 A | 5/1998 | Harrison et al. | 250/492.21 |
| 5,751,002 A * | 5/1998 | Ogata et al. | 250/492.21 |
| 5,767,522 A | 6/1998 | Kodama | 250/398 |
| 5,932,882 A | 8/1999 | England et al. | 250/492.21 |
| 5,969,366 A | 10/1999 | England et al. | 250/492.21 |
| 6,111,260 A * | 8/2000 | Dawson et al. | 250/492.21 |
| 6,130,436 A * | 10/2000 | Renau et al. | 250/492.21 |
| 6,242,750 B1 * | 6/2001 | Takahashi et al. | 250/492.21 |
| 6,326,631 B1 * | 12/2001 | Politiek et al. | 250/492.21 |

FOREIGN PATENT DOCUMENTS

| | | |
|---|---|---|
| EP | 0 685 872 | 12/1995 |

OTHER PUBLICATIONS

H. Glavish et al, "Fast Magnetic Scanning and Ion Optical Features of the New Ibis Oxygen Implanter", Ion Implantation Tech., D.F. Downey et al (eds.), 1993 Elsevier Science Publ. B.V., pp. 397-400.

A. Ray et al, "Overview of the Eaton NV-8200p High-Beam Purity, Parallel Scanning Implanter", Ion Implantation Technology—92, D. F. Downey et al (eds.), 1993 Elsevier Science Publ. B. V., pp. 401-404.

* cited by examiner

ION IMPLANTER HAVING TWO-STAGE DECELERATION BEAMLINE

CROSS REFERENCE TO RELATED APPLICATION

This application claims the benefit of provisional application Ser. No. 60/140,466 filed Jun. 23, 1999, which is hereby incorporated by reference.

FIELD OF THE INVENTION

This invention relates to systems and methods for ion implantation and, more particularly, to methods and apparatus for delivery of low energy, monoenergetic ion beams to an ion implantation target, such as a semiconductor wafer.

BACKGROUND OF THE INVENTION

Ion implantation has become a standard technique for introducing conductivity-altering impurities into semiconductor wafers. A desired impurity material is ionized in an ion source, the ions are accelerated to form an ion beam of prescribed energy and the ion beam is directed at the surface of the wafer. The energetic ions in the beam penetrate into the bulk of the semiconductor material and are embedded into the crystalline lattice of the semiconductor material to form a region of desired conductivity.

Ion implantation systems usually include an ion source for converting a gas or solid material into a well-defined ion beam. The ion beam is mass analyzed to eliminate undesired ion species, is accelerated to a desired energy and is directed onto a target plane. The beam may be distributed over the target area by beam scanning, by target movement or by a combination of beam scanning and target movement. Examples of prior art ion implanters are disclosed in U.S. Pat. No. 4,276,477 issued Jun. 30, 1981 to Enge; U.S. Pat. No. 4,283,631 issued Aug. 11, 1981 to Turner; U.S. Pat. No. 4,899,059 issued Feb. 6, 1990 to Freytsis et al.; and U.S. Pat. No. 4,922,106 issued May 1, 1990 to Berrian et al.

U.S. Pat. No. 5,350,926 issued Sep. 27, 1994 to White et al. discloses a high current, broad beam ion implanter which employs a high current density ion source, an analyzing magnet to direct a desired species through a resolving slit and an angle corrector magnet to deflect the resultant beam, while rendering it parallel and uniform along its width dimension. A ribbon-shaped beam is delivered to a target, and the target is moved perpendicular to the long dimension of the ribbon beam to distribute the ion beam over the target.

A well-known trend in the semiconductor industry is toward smaller, higher speed devices. In particular, both the lateral dimensions and the depths of features in semiconductor devices are decreasing. State of the art semiconductor devices require junction depths less than 1,000 Angstroms and may eventually require junction depths on the order of 200 Angstroms or less.

The implanted depth of the dopant material is determined, at least in part, by the energy of the ions implanted into the semiconductor wafer. Shallow junctions are obtained with low implant energies. However, ion implanters are typically designed for efficient operation at relatively high implant energies, for example in the range of 20 keV to 400 keV, and may not function efficiently at the energies required for shallow junction implantation. At low implant energies, such as energies of 2 keV and lower, the current delivered to the wafer is much lower than desired and in some cases may be near zero. As a result, extremely long implant times are required to achieve a specified dose, and throughput is adversely affected. Such reduction in throughput increases fabrication cost and is unacceptable to semiconductor device manufacturers.

In one prior art approach to low energy ion implantation, the ion implanter is operated in a drift mode with the accelerator turned off. Ions are extracted from the ion source at low voltage and simply drift from the ion source to the target semiconductor wafer. However, a small ion current is delivered to the wafer because the ion source operates inefficiently at low extraction voltages. In addition, the beam expands as it is transported through the ion implanter, and ions may strike components of the ion implanter along the beamline rather than the target semiconductor wafer.

Another prior art approach utilizes a deceleration electrode in the vicinity of the semiconductor wafer. See, for example, European Patent Application No. 0,451,907 published Oct. 16, 1991. Ions are extracted from the source, are accelerated by a higher voltage and then are decelerated by the deceleration electrode before being implanted into the wafer. This approach also suffers from ion beam expansion and energy contamination in the beam delivered to the wafer. An ion implanter wherein a deceleration electrode is positioned between an ion source and a mass separator is disclosed in European Patent Application No. 0,685,872 published Dec. 6, 1995.

Delivery of low (less than 10 keV) and ultra-low (less than 1 keV) energy, mass resolved, monoenergetic ion beams to a target with currents greater than a few microamperes is difficult. As noted above, space charge effects can produce rapid divergence of the beam envelope, impeding transmission and reducing the ultimate beam current delivered to the target. As further noted above, beams are often transported to the vicinity of the target at higher energies and are then decelerated to the final energy by means of a retarding electric field in order to overcome the beam expansion problem. A consequence of the deceleration is that ions neutralized prior to entering the retarding field region impact the target with the transport energy. These higher energy neutralized ions are implanted into the wafer and are likely to have adverse affects on device performance due to their deeper than desired location below the surface.

For ion implantation, two properties of this higher energy implant, or energy contaminant, are important: the quantity of neutralized high energy ions and their energy at the moment of neutralization. Typical single magnet beamlines require the beam to possess several multiples of the final energy to achieve satisfactory beam currents. Moreover, the necessary species selection and mass resolution of the final implant beam demand a long path from the exit of the magnet to the target, thereby increasing the total number of ions neutralized. Consequently, conventional beamlines designed to produce milliamps of beam current at low and ultra-low energies must contend with an undesired energy contaminant comprising large numbers of neutralized high energy ions.

Known prior art ion implanters are not capable of delivering relatively high current, energy pure ion beams at low and ultra-low energies. Accordingly, there is a need for improved methods and apparatus for low energy ion implantation.

SUMMARY OF THE INVENTION

According to a first aspect of the invention, an ion implanter is provided. The ion implanter comprises an ion source for generating an ion beam at a first voltage $V_0$, an analyzer for separating unwanted components from the ion beam, a beam transport device for transporting the ion beam through the analyzer at a first transport energy, a deceleration stage positioned downstream of the analyzer for decelerating the ion beam from the first transport energy to a final energy, a beam filter comprising a magnet positioned downstream of the deceleration stage for separating neutral particles from the ion beam, and a target site for supporting a target for ion implantation. The ion beam is transported through the beam filter and is delivered to the target site at the final energy. Preferably, the final energy is equal to the ion charge times the first voltage $V_0$.

According to a second aspect of the invention, an ion implanter is provided. The ion implanter comprises an ion source for generating an ion beam at a first voltage $V_0$, an analyzer for separating unwanted components from the ion beam, a first beam transport device for transporting the ion beam through the analyzer at a first transport energy, a first deceleration stage positioned downstream of the analyzer for decelerating the ion beam from the first transport energy to a second transport energy, a beam filter positioned downstream of the first deceleration stage for separating neutral particles from the ion beam, a second beam transport device for transporting the ion beam through the beam filter at the second transport energy, a second deceleration stage positioned downstream of the beam filter for decelerating the ion beam from the second transport energy to a final energy, and a target site for supporting a target for ion implantation. The ion beam is delivered to the target site at the final energy.

The analyzer may comprise an analyzing magnet and a resolving slit. Ions of a desired species are deflected by the analyzing magnet so as to pass through the resolving slit. Preferably, the beam filter comprises an angle corrector magnet for directing ions in the ion beam along substantially parallel trajectories. The ion source may comprise an arc chamber and a first power supply for biasing the arc chamber at the first voltage $V_0$. The first beam transport device may comprise a second power supply for biasing components of the analyzer at a second voltage $V_1$ that in part defines the first transport energy. The second beam transport device may comprise a third power supply for biasing the beam filter at a third voltage $V_2$ that in part defines the second transport energy.

The ion source may generate a ribbon-shaped ion beam. The ion implanter may further comprise a beam sensing and control assembly for adjusting the ribbon-shaped ion beam to be substantially uniform across its width.

The ion implanter may further comprise at least one electron generator for supplying electrons to the ion beam for limiting beam expansion.

The first and second deceleration stages may each include a deceleration electrode for decelerating ions in the ion beam and a suppression electrode for suppressing flow of electrons in the ion beam from one energy region to another. The deceleration electrode of the first deceleration stage may be movable in the direction of transport of the ion beam for adjusting the beam focusing properties of the first deceleration stage.

According to a third aspect of the invention, a method is provided for implanting ions in a target. The method comprises the steps of generating an ion beam at a first voltage $V_0$, separating unwanted components from the ion beam in an analyzer, transporting the ion beam through the analyzer at a first transport energy, decelerating the ion beam from the first transport energy to a final energy downstream of the analyzer, separating neutral particles from the ion beam, in a beam filter comprising a magnet, after decelerating the ion beam from the first transport energy to the final energy, and delivering the ion beam to a target site at the final energy.

According to a fourth aspect of the invention, a method is provided for implanting ions in a target. The method comprises the steps of generating an ion beam at a first voltage $V_0$, separating unwanted components from the ion beam in an analyzer, transporting the ion beam through the analyzer at a first transport energy, decelerating the ion beam from the first transport energy to a second transport energy in a first deceleration stage positioned downstream of the analyzer, separating neutral particles from the ion beam in a beam filter positioned downstream of the first deceleration stage, transporting the ion beam through the beam filter at the second transport energy, decelerating the ion beam from the second transport energy to a final energy in a second deceleration stage positioned downstream of the beam filter, and delivering the ion beam to a target site at the final energy.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
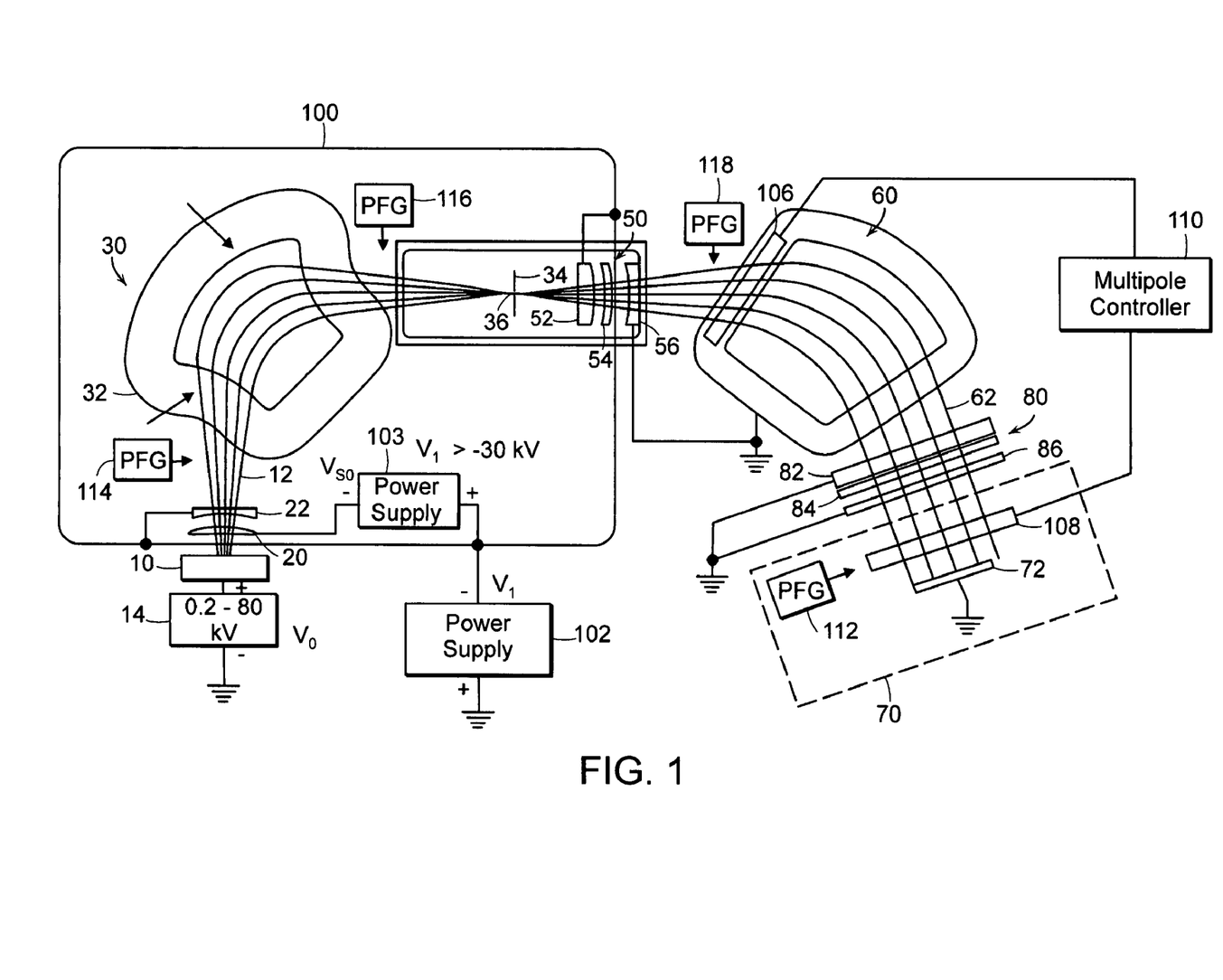
FIG. 1 is a simplified schematic diagram of an ion implanter in accordance with an embodiment of the invention, operating in an enhanced drift mode.

A block diagram of an ion implanter in accordance with an embodiment of the invention is shown in FIG. 1. An ion source 10 generates ions and supplies an ion beam 12. As known in the art, ion source 10 may include an ion chamber and a gas box containing a gas to be ionized. The gas is supplied to the ion chamber where it is ionized. The ions thus formed are extracted from the ion chamber to form ion beam 12. Ion beam 12 has an elongated cross section and is ribbon-shaped, with a long dimension of the beam cross section preferably having a horizontal orientation. A first power supply 14 is connected to an extraction electrode of ion source 10 and provides a positive first voltage $V_0$. First voltage $V_0$ may be adjustable, for example, from about 0.2 to 80 kV. Thus, ions from ion source 10 are accelerated to energies of about 0.2 to 80 keV by the first voltage $V_0$. The construction and operation of ion sources are well known to those skilled in the art.

Ion beam 12 passes through a suppression electrode 20 and a ground electrode 22 to a mass analyzer 30. The mass analyzer 30 includes a resolving magnet 32 and a masking electrode 34 having a resolving aperture 36. Analyzing magnet 32 deflects ions in ion beam 12 such that ions of a desired ion species pass through resolving aperture 36 and undesired ion species do not pass through resolving aperture 36 but are blocked by the masking electrode 34. In a preferred embodiment, resolving magnet 32 deflects ions of the desired species by 90°.

Ions of the desired ion species pass through resolving aperture 36 to a first deceleration stage 50 positioned downstream of mass analyzer 30. Deceleration stage 50 may include an upstream electrode 52, a suppression electrode 54 and a downstream electrode 56. Ions in the ion beam are decelerated by deceleration stage 50 as described below and then pass through an angle corrector magnet 60. Angle corrector magnet 60 deflects ions of the desired ion species and converts the ion beam from a diverging ion beam to a ribbon ion beam 62 having substantially parallel ion trajectories. In a preferred embodiment, angle corrector magnet 60 deflects ions of the desired ion species by 70°.

An end station 70 supports one or more semiconductor wafers, such as wafer 72, in the path of ribbon ion beam 62 such that ions of the desired species are implanted into the semiconductor wafers. The end station 70 may include a cooled electrostatic platen and a scanner for moving wafer 72 perpendicular to the long dimension of the ribbon ion beam 62 cross section, so as to distribute ions over the surface of wafer 72. The ion implanter may include a second deceleration stage 80, which is not utilized in the configuration of FIG. 1. Deceleration stage 80 is positioned downstream of angle corrector magnet 60.

The ion implanter may include additional components known to those skilled in the art. For example, end station 70 typically includes automated wafer handling equipment for introducing wafers into the ion implanter and for removing wafers after implantation. End station 70 may also include a dose measuring system, an electron flood gun and other known components. It will be understood that the entire path traversed by the ion beam is evacuated during ion implantation.

In the configuration of FIG. 1, referred to as the "enhanced drift" mode, a beamline module 100, comprising mass analyzer 30, ground electrode 22 and electrode 52 of deceleration stage 50, is coupled to a second power supply 102. A second voltage $V_1$, generated by power supply 102, is coupled to the components of beamline module 100 and accelerates ion beam 12 to an energy that is sufficient for transport without excessive beam expansion. Typically, power supply 102 is adjusted to provide a negative transport voltage up to -30 kV. The components of beamline module 100 are electrically isolated from ground and from other implanter components, so that they may be biased at voltage $V_1$. A power supply 103, referenced to power supply 102, is used to bias suppression electrode 20 more negatively than the beamline module 100 potential $V_1$ (electrode 22 potential) by a voltage $V_{S0}$ equal to or greater than -1 kV to suppress the flow of electrons in the ion beam from one energy region to another. A power supply 104 (FIG. 7), referenced to power supply 102, is used to bias suppression electrode 54 more negatively than the beamline module 100 potential $V_1$ (electrode 52 potential) by a voltage $V_{s1}$ equal to or greater than -1 kV to suppress the flow of electrons in the ion beam from one energy region to another. Downstream electrode 56 of deceleration stage 50, angle corrector magnet 60 and wafer 72 are held at ground potential in the configuration of FIG. 1.

The ion implanter preferably further includes a beam sensing and control assembly for adjusting the ribbon ion beam 62 to be substantially uniform across its width. The beam sensing and control assembly includes a multipole element 106, a beam profiler 108 and a multipole controller 110. The multipole element 106 adjusts the uniformity of ribbon ion beam 62 in response to control signals from multipole controller 110. The multipole element 106 may be located at or near the entrance to or the exit from angle corrector magnet 60, but is not limited to these locations. The beam profiler 108, positioned to intercept ribbon ion beam 62, senses the uniformity of ribbon ion beam 62 and provides a sense signal to multipole controller 110. The multipole controller 110 provides control signals to multipole element 106 to ensure uniformity across the width of ribbon ion beam 62. The sensing of ribbon ion beam 62 by profiler 108 and the adjustment of multipole element 106 is performed prior to implantation of wafer 72 and may be performed at intervals during operation of the ion implanter to ensure that the uniformity of ribbon ion beam 62 is maintained. It will be understood that beam profiler 108 is removed from the path of the ion beam to wafer 72 during ion implantation of the wafer. The first deceleration stage 50 and the second deceleration stage 80 may perturb the uniformity of ribbon ion beam 62 and, therefore, require a different adjustment than would be required in the absence of the deceleration stages. The adjustment of a ribbon ion beam for uniformity is described in the aforementioned U.S. Pat. No. 5,350,926, which is hereby incorporated by reference. The use of a beam profiler to adjust ion beam uniformity is disclosed in the aforementioned U.S. Pat. No. 4,922,106, which is hereby incorporated by reference. The adjustment of ribbon ion beam uniformity is also incorporated in the model SHC-80 ion implanter, manufactured and sold by Varian Semiconductor Equipment Associates, Inc. of Gloucester, Mass.

As noted above, space charge expansion of the ion beam is particularly severe in the case of low energy beams. A result of space charge expansion is reduced beam current delivered to the wafer 72, is because part of the expanded ion beam is intercepted by beamline components. One way to limit space charge expansion of the ion beam is to provide electrons which are transported with the ion beam and which reduce the electric fields tending to produce space charge expansion. Accordingly, one or more electron generators in the form of electron sources or plasma flood guns (PFG) may be utilized in the ion implanter to reduce the effect of space charge induced beam expansion. One or more plasma flood guns may be located in the ion implanter as permitted by the structure and geometry of the ion implanter. As shown in FIG. 1, a plasma flood gun 112 may be located in front of wafer 72 to limit space charge expansion and to limit charge buildup on the surface of wafer 72. A plasma flood gun 114 may be located at the entrance to analyzing magnet 32, and/or a plasma flood gun 116 may be located at the exit of analyzing magnet 32. A plasma flood gun 118 may be located at the entrance of angle corrector magnet 60. It will be understood that plasma flood guns or other electron generating devices may be located at selected locations along the ion beam to limit space charge expansion.

Figure 2:
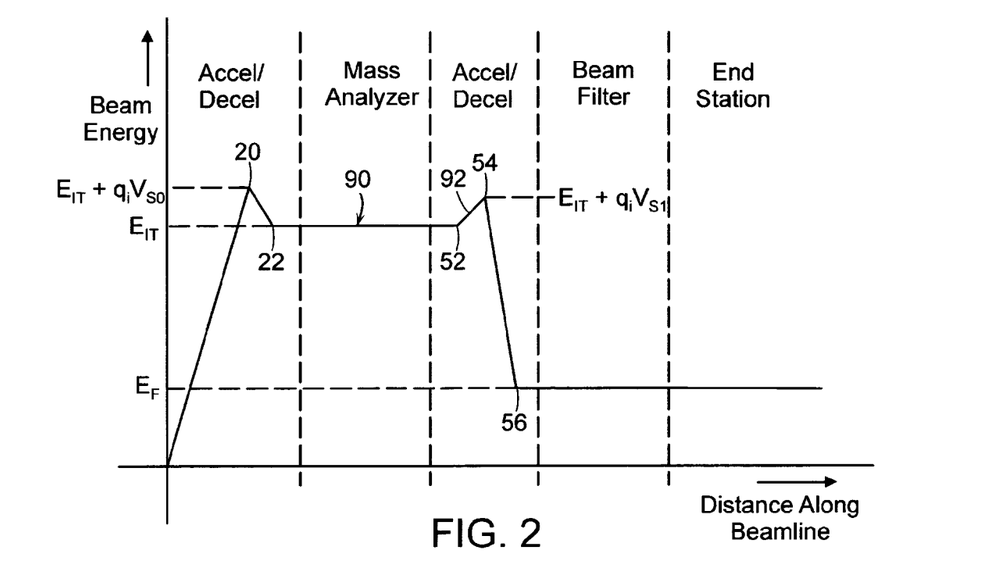
FIG. 2 is a graph of beam energy as a function of distance along the beamline, representative of the enhanced drift mode shown in FIG. 1.

FIG. 2 is a graph of beam energy as a function of distance along the beamline. Curve 90 represents beam energy in the ion implanter configuration of FIG. 1. In FIG. 2, reference numbers 20, 22, 52, 54 and 56 indicate the locations of the corresponding electrodes along the beamline. As shown, ion beam 12 is extracted from ion source 10 by the combined potentials $V_0+V_1+V_{S0}$ supplied by power supplies 14, 102 and 103, respectively. The ion beam 12 is then decelerated to a first transport energy $E_{1T=qi}$ ($V_0+V_1$), where $q_i$ represents the ion charge, prior to entering mass analyzer 30. As the ion beam 12 exits the beamline module 100, it is accelerated to energy $E=q_i$ ($V_0+V_1+V_{S1}$) by the bias on suppression electrode 54, as indicated by energy increase 92. The ion beam 12 is then decelerated at electrode 56 to a final energy $E_F=q_i$ ($V_0$), and the beam is transported through angle corrector magnet 60 to end station 70 at final energy $E_F$.

In summary, first power supply 14 provides first voltage $V_0$, and second power supply 102 provides second voltage $V_1$. The ion beam is transported through analyzer 30 at the first transport energy $E_{1T}=q_i$ ($V_0+V_1$) and is transported through angle corrector magnet 60 and delivered to wafer 72 at the final energy $E_F=q_i$ ($V_0$).

As shown in FIG. 2, the final implantation energy delivered to wafer 72 is the ion charge $q_i$ times the ion source potential $V_0$ established by first power supply 14. The mass analyzer 30 is biased at a negative potential, up to −30 kV, thus providing an extraction and transport energy of 30 keV plus the implantation energy. The deceleration stage 50 is located downstream of the resolving aperture 36 and upstream of the entrance to the angle corrector magnet 60. The deceleration stage 50 has the effect of producing a virtual source of mass resolved, low energy ions directly after the resolving aperture 36, effectively shortening by approximately 50% the beamline length over which the low energy ions are transported. Because the ion beam 12 is transported through beamline module 100 at relatively high energy, beam expansion is limited. Although beam expansion may occur between downstream electrode 56 of deceleration stage 50 and wafer 72, the distance over which beam expansion occurs is relatively small. In addition, the angle corrector magnet 60 following deceleration stage 50 acts as a beam filter for charge exchanged high-energy contaminants. In particular, neutralized ions are not deflected by the angle corrector magnet 60 and do not reach wafer 72.

Figure 3:
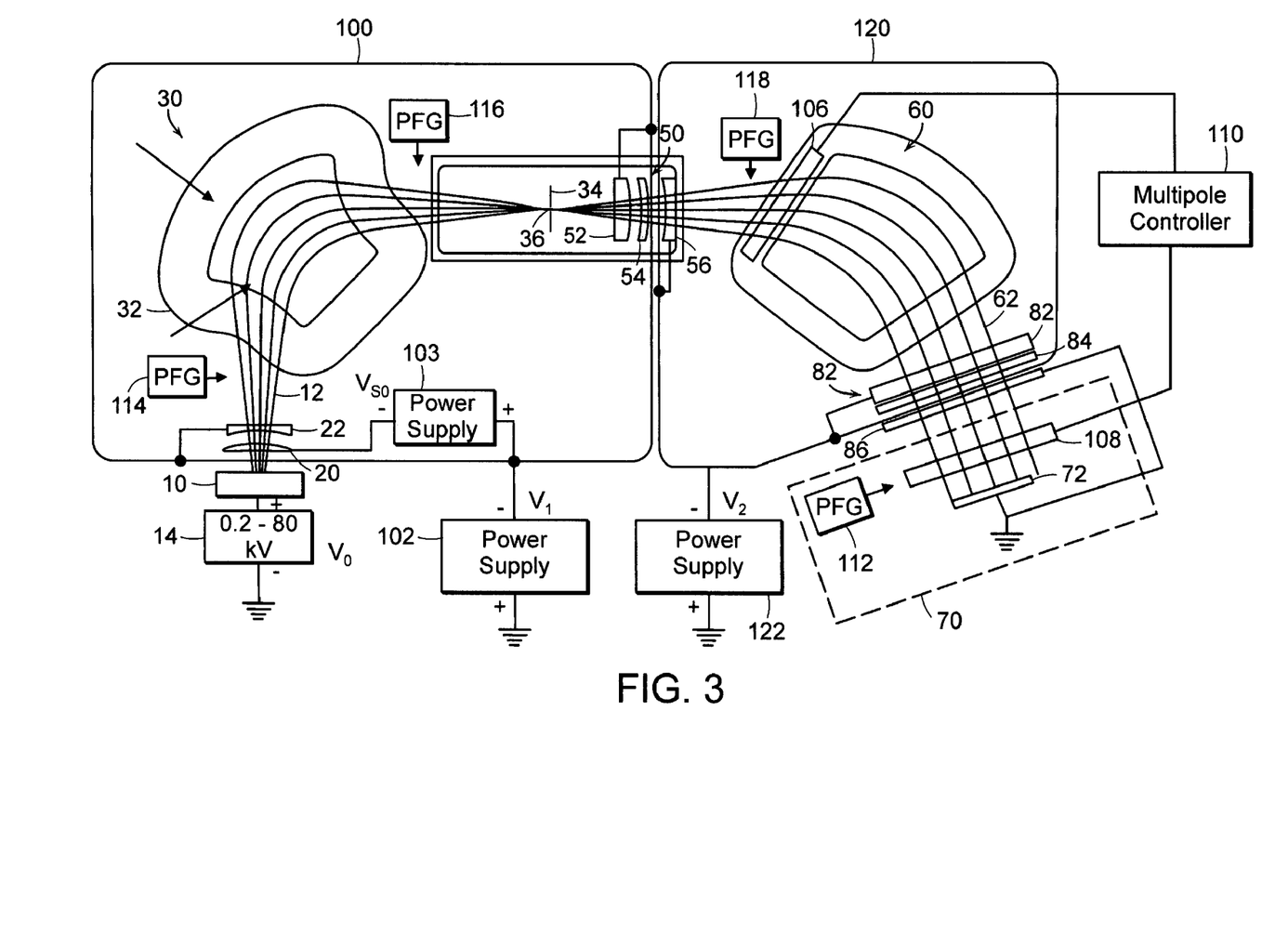
FIG. 3 is a simplified schematic diagram of an ion implanter in accordance with an embodiment of the invention, operating in a double deceleration mode.

A second configuration of an ion implanter in accordance with an embodiment of the invention is shown in FIG. 3. Like elements in FIGS. 1 and 3 have the same reference numerals. Deceleration electrode 80 may include an upstream electrode 82, a suppression electrode 84 and a downstream electrode 86. In the configuration of FIG. 3, known as the "double deceleration" mode, the ion implanter includes beamline module 100 and a second beamline module 120. The beamline module 120 comprises downstream electrode 56 of deceleration stage 50, angle corrector magnet 60 and electrode 82 of the deceleration stage 80, which are coupled to a third power supply 122. Power supply 122 generates a negative voltage $V_2$, typically up to −5 kV. A power supply 124 (FIG. 9), referenced to power supply 122, is used to bias suppression electrode 84 more negatively than the beamline mode 120 potential (electrode 82 potential) by a voltage $V_{S2}$ equal to or greater than −1 kV to suppress the flow of electrons from one energy region to another. The components of beamline module 120 are electrically isolated from ground and from other implanter components, so that they may be biased at voltage $V_2$. The supply voltage $V_2$ applied to the components of beamline module 120 decelerates the ion beam 12 from the energy established by beamline module 100 to a second transport energy established by beamline module 120. The downstream electrode 86 of deceleration stage 80 is grounded in this configuration, so that the ion beam is further decelerated to the final energy $E_F=q_i$ ($V_0$) established by power supply 14 before implantation into wafer 72.

Figure 4:
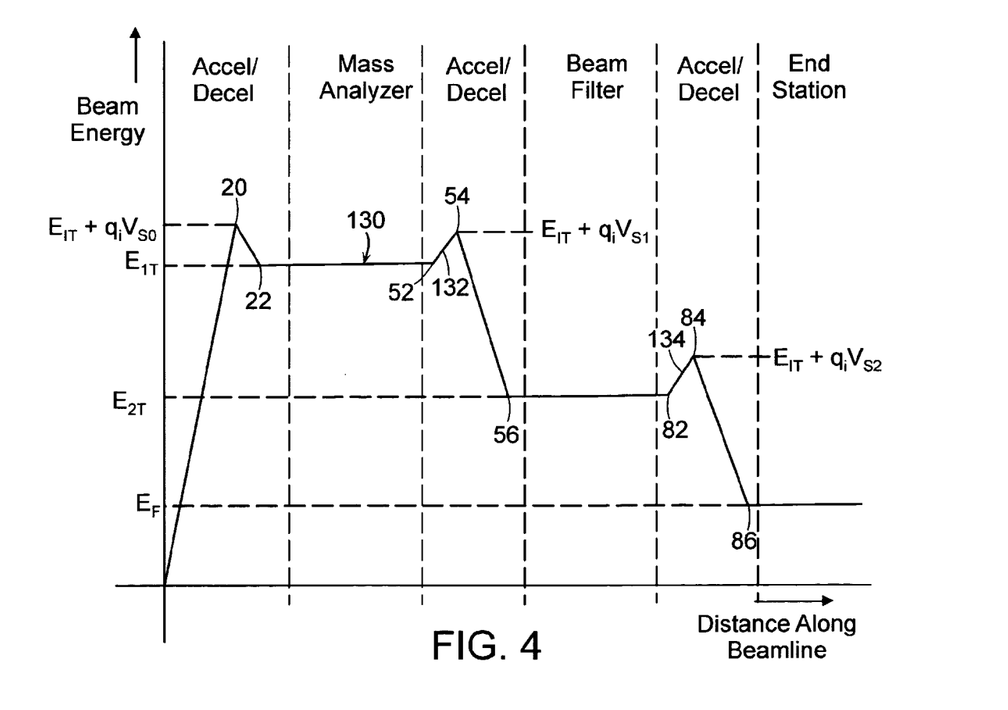
FIG. 4 is a graph of beam energy as a function of distance along the beamline, representative of the double deceleration mode shown in FIG. 3.

FIG. 4 is a graph of beam energy as a function of distance along the beamline. Curve 130 represents beam energy in the ion implanter configuration of FIG. 3. In FIG. 4, reference numbers 20, 22, 52, 54, 56, 82, 84 and 86 indicate the locations of the corresponding electrodes along the beamline. As shown, ion beam 12 is extracted from ion source by the combined potentials $V_0+V_1+V_{S0}$ supplied by power supplies 14, 102 and 103, respectively. The ion beam 12 is then decelerated to the first transport energy $E_{1T}=q_i$ ($V_0+V_1$) prior to entering mass analyzer 30. As the ion beam 12 exits the beamline module 100, it is accelerated to energy $E=q_i$ ($V_0+V_1+V_{S1}$) by the bias on suppression electrode 54, as indicated by energy increase 132. The ion beam 12 is then decelerated at electrode 56 to a second transport energy $E_{2T}=q_i$ ($V_0+V_2$), where $V_2$ is determined by power supply 122. The beam is transported through angle corrector magnet 60 at second transport energy $E_{2T}$. As the beam exits the beamline module 120, it is accelerated to energy $E=q_i$ ($V_0+V_2+V_{S2}$) by the bias on suppression electrode 84, as indicated by energy increase 134. The ion beam 12 is then decelerated at electrode 86 to final energy $E_F=q_i$ ($V_0$), and the beam is delivered to wafer 72 in end station 70 at final energy $E_F$. As in the configuration of FIG. 1, the final implantation energy delivered to wafer 72 is the ion charge $q_i$ times the ion source potential $V_0$ established by extraction power supply 14.

In summary, first power supply provides first voltage $V_0$, second power supply 102 provides second voltage $V_1$ and third power supply 122 provides third voltage $V_2$. The ion beam 12 is transported through analyzer 30 at the first transport energy $E_{1T}=q_i$ ($V_0+V_1$), is transported through angle corrector magnet 60 at the second transport energy $E_{2T}=q_i$ ($V_0+V_2$) and is delivered to wafer 72 at final energy $E_F=q_i$ ($V_0$).

As compared with the ion implanter configuration of FIG. 1, the ion implanter configuration of FIG. 3 delivers higher current to wafer 72 because the ion beam is transported through angle corrector magnet 60 at second transport energy $E_{2T}=q_i$ ($V_0+V_2$), and beam expansion is reduced. Some neutralizing collisions occur within beamline module 120. However, the ion energy within beamline module 120 and the length over which neutralized ions have a line of sight path to wafer 72 are both small, so that an energy pure ion beam is implanted in wafer 72.

In another operating mode, which is a special case of the configuration shown in FIG. 3 and described above, beamline module 100 and beamline module 120 are electrically connected together to form a single stage deceleration system. In this operating mode, beamline modules 100 and 120 are biased by one of power supplies 102 and 122, and deceleration of the ion beam occurs at deceleration stage 80.

Figure 5:
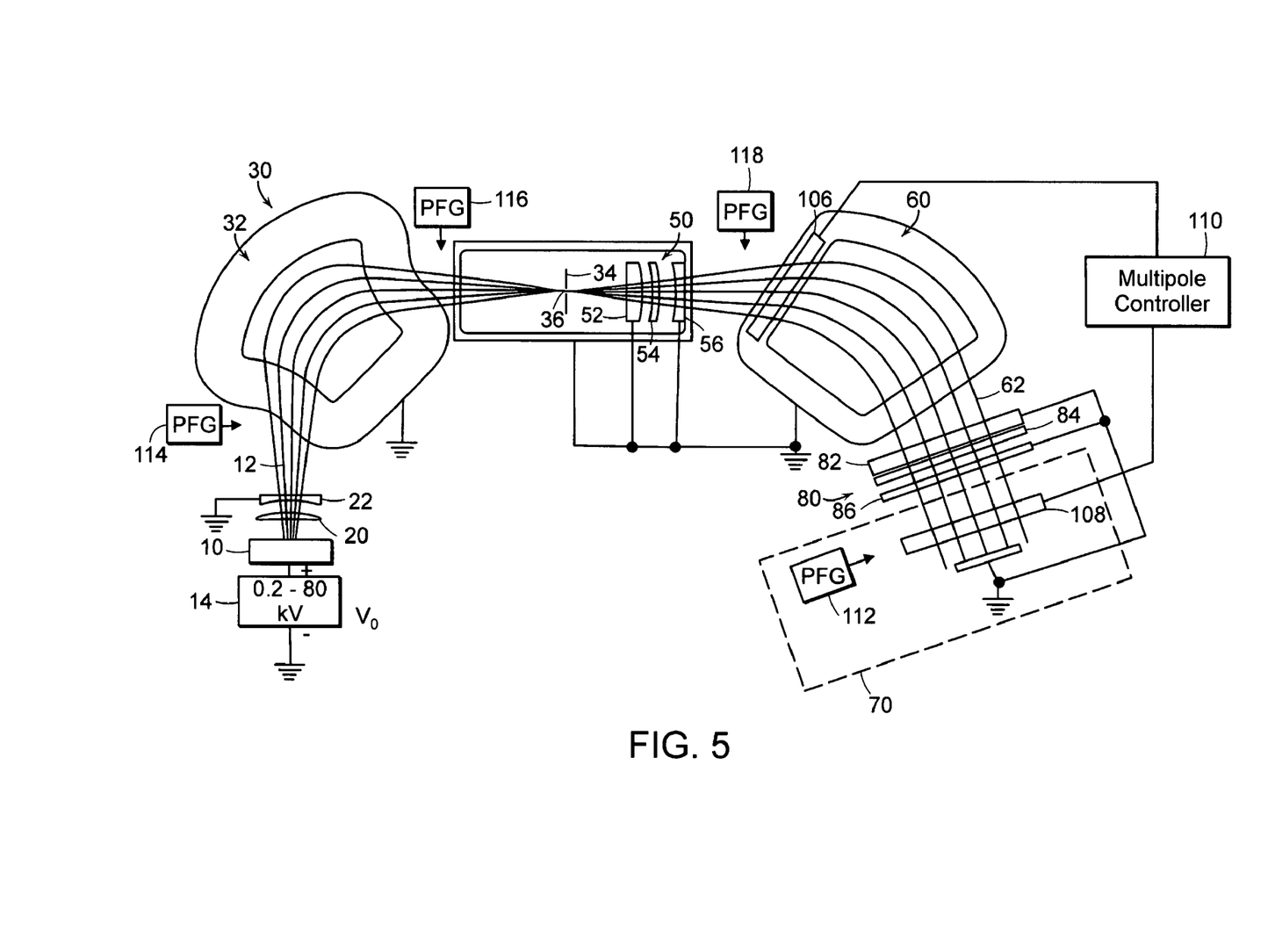
FIG. 5 is a simplified schematic diagram of an ion implanter in accordance with an embodiment of the invention; operating in a drift mode.

A third configuration of an ion implanter in accordance with an embodiment of the invention is shown in FIG. 5. Like elements in FIGS. 1, 3 and 5 have the same reference numerals. In the configuration of FIG. 3, mass analyzer 30, first deceleration stage 50, angle corrector magnet 60, second deceleration stage 80 and wafer 72 are all grounded. Thus, ion beam 12 is transported through the beamline components at final energy $E_F=q_i$ ($V_0$) established by power supply 14 and is delivered to wafer 72 at final energy $E_F$. This configuration, known as "drift" mode, results in beam expansion at lower energies and is primarily useful for higher energies established by power supply 14. As indicated by curve 140 in FIG. 6, ion beam 12 is transported from source 10 to wafer 72 at energy $E_F$.

Figure 6:
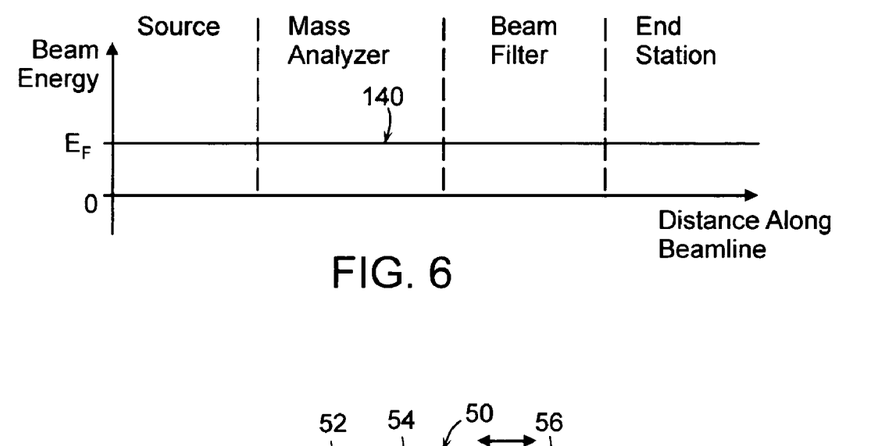
FIG. 6 is a graph of beam energy as a function of distance along the beamline, representative of the drift mode shown in FIG. 5.

The enhanced drift mode shown in FIGS. 1 and 2, the double deceleration mode shown in FIGS. 3 and 4 and the drift mode shown in FIGS. 5 and 6 may be implemented as separate ion implanters or as a single ion implanter which may be configured in a selected operating mode. For example, the ion implanter shown in FIG. 3 may be operated in a double deceleration mode as shown. In order to operate the ion implanter of FIG. 3 in the enhanced drift mode of FIG. 1, power supply 122 may be turned off, and beamline module 120 may be connected to ground. In order to operate the ion implanter of FIG. 3 in the drift mode, power supplies 102 and 122 may both be turned off, and beamline modules 100 and 120 may be connected to ground. Preferably, power supply 14, power supply 102 and power supply 122 are all referenced to ground, thus avoiding the need for large resistors between beamline components.

In a preferred embodiment, the voltage $V_1$ of power supply 102 may be variable in a range of 0 to −30 kV and the voltage $V_2$ of power supply 122 may be variable in a range of 0 to −1 kV. The voltages $V_1$ $_{and}$ $_{V2}$ may be adjusted to be the same or different in a particular application. Typically, voltage $V_2$ is set closer to ground than voltage $V_1$. Power supplies 103, 104 and 124 may be variable in a range of 0 to −15 kV.

In the ion implanter configurations of FIGS. 1, 3 and 5, angle corrector magnet 60 performs the dual functions of directing ions in the ion beam along substantially parallel trajectories and removing neutralized ions. The neutralized ions are not deflected by angle corrector magnet 60 and may be intercepted by a beam dump (not shown). In other embodiments, such as those which do not use an angle corrector magnet, the beam filter may be a separate component of the ion implanter. The beam filter may be a magnetic or electrostatic device which deflects the charged particles in the ion beam toward the target site, while neutralized ions are not deflected and do not reach the target site.

The ion implanter shown and described herein has a number of important advantages in comparison with prior art ion implanters. The ion implanter permits delivery of low energy, monoenergetic ion beams to semiconductor wafers at relatively high current levels. For low energy applications requiring the highest energy purity, the enhanced drift mode of FIG. 1 may be utilized. For low energy applications requiring high energy purity and the highest current level, the double deceleration mode of FIG. 5 may be utilized. At higher energies where the effect of space charge induced beam expansion is reduced, the drift mode of FIG. 5 may be utilized. The first deceleration stage 50 produces a virtual source of mass resolved, low energy ions directly after resolving aperture 36. The mass analyzer 30 may be large to provide high mass resolution at high energies, while maintaining high beam current levels at low energies, because the ion beam is transported through mass analyzer 30 at high energy in the enhanced drift mode and the double deceleration mode. Accordingly, the ion implanter provides high performance over a wide range of energies, including very low energies.

Figure 7:
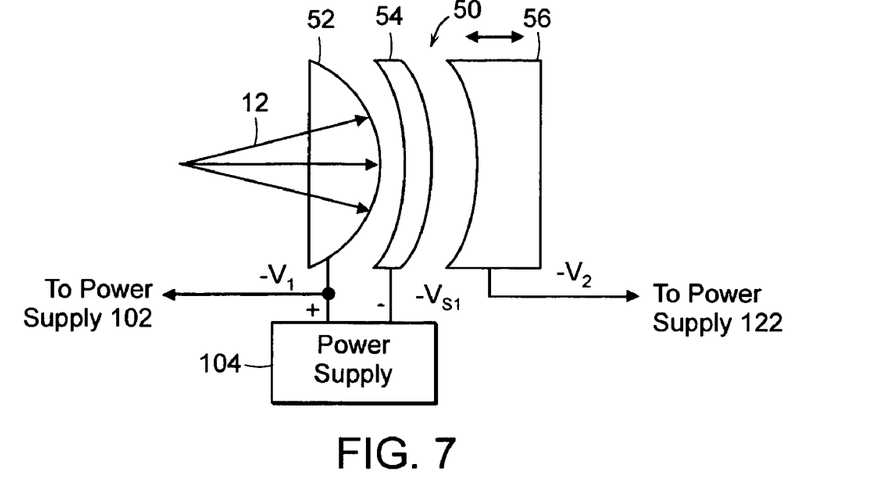
FIG. 7 is a simplified top view of an embodiment of the first deceleration stage shown in FIGS. 1–3.
Figure 8:
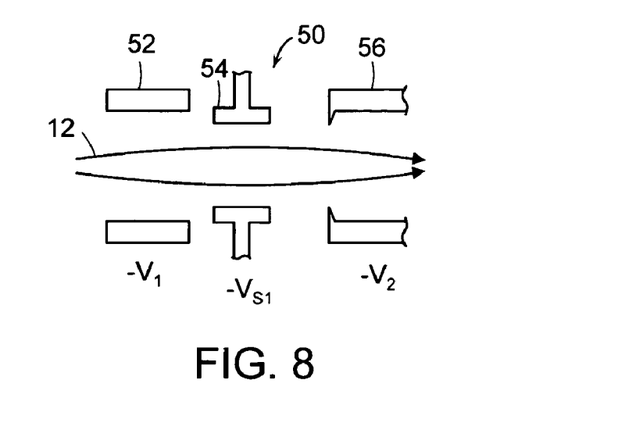
FIG. 8 is a simplified side view of the deceleration stage of FIG. 7.

Simplified schematic top and side views of an example of first deceleration stage 50 are shown in FIGS. 7 and 8, respectively. As shown, upstream electrode 52 is connected to voltage $V_1$ of beamline module 100 (power supply 102), downstream electrode 56 is connected to voltage $V_2$ of beamline module 120 (power supply 122), and suppression electrode 54 is connected to a suppression voltage $V_{S1}$ (power supply 104). The suppression voltage $V_{S1}$ of power supply 104 is negative with respect to the voltage $V_1$ on electrode 52. As described above, one or both of electrodes 52 and 56 may be connected to ground, depending on the selected operating mode.

As best shown in FIG. 7, the downstream surface of electrode 52, the upstream and downstream surfaces of suppression electrode 54 and the upstream surface of electrode 56 may have curvatures selected such that the ion beam 12 is perpendicular to the surfaces at all points. Preferably, the gap between the suppression electrode 54 and the downstream electrode 56 is adjustable to provide tunable focusing of the ion beam. As best shown in FIG. 8, first deceleration stage 50 preferably provides some focusing of ion beam 12 in a vertical plane to increase beam transmission through angle corrector magnet 60.

Figure 9:
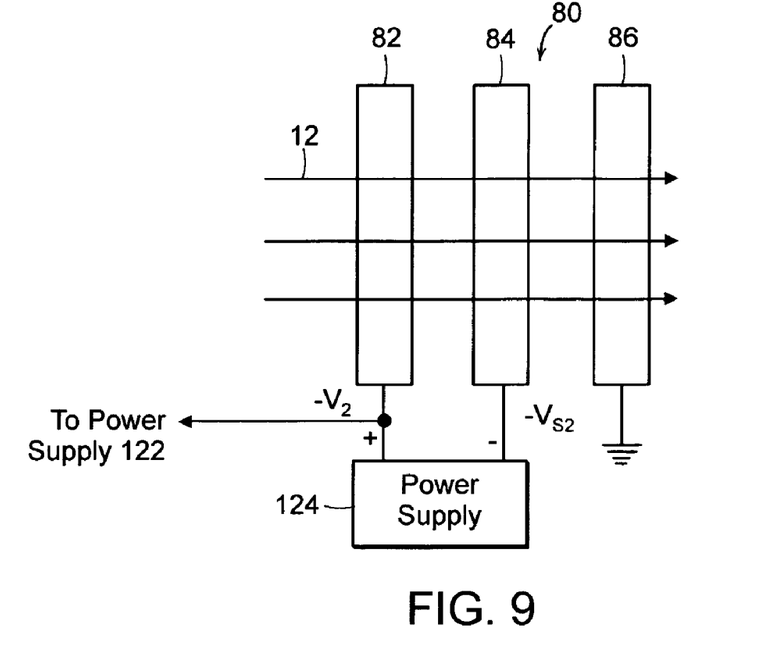
FIG. 9 is a simplified top view of an embodiment of the second deceleration stage shown in FIGS. 1–3.
Figure 10:
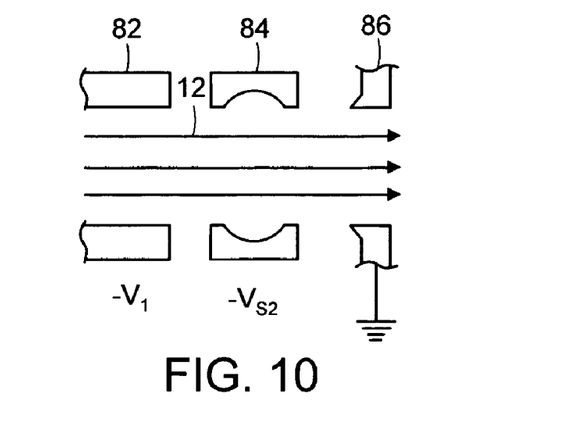
FIG. 10 is a simplified side view of the deceleration stage of FIG. 9.

Simplified schematic top and side views of an example of second deceleration stage 80 are shown in FIGS. 9 and 10, respectively. Upstream electrode 82 is at the voltage $V_2$ of beamline module 120 established by power supply 122, and downstream electrode 86 is grounded. Suppression electrode 84 is biased by power supply 124 at a suppression voltage $V_{S2}$ that is negative with respect to voltage $V_2$ of electrode 82. Electrodes 82, 84 and 86 may be shaped to minimize focusing of the parallel ion beam supplied by angle corrector magnet 60. Thus, the electrodes are configured to eliminate curvature of potential lines and to provide a single upstream component of force on ions in the ion beam.

The present invention may be utilized in different ion implanter architectures. In one configuration, shown by way of example in FIG. 1, the beam is transported at relatively high energy, is decelerated to lower energy and then is passed through a beam filter to remove neutralized ions. In another configuration, shown by way of example in FIG. 3, the ion beam is transported at relatively high energy through a portion of the ion implanter beamline, is decelerated to an intermediate energy by a first deceleration stage, is passed through a beam filter to remove neutralized ions and then is decelerated to low energy for implantation into a wafer. The disclosed configurations can be implemented in a single ion implanter or in different ion implanters.

While there have been shown and described what are at present considered the preferred embodiments of the present invention, it will be obvious to those skilled in the art that various changes and modifications may be made therein without departing from the scope of the invention as defined by the appended claims.

What is claimed is:

1. An ion implanter comprising:
   an ion source for generating a low energy, monoenergetic ion beam at a first voltage $V_0$ for delivery to an ion implantation target;
   an analyzer for separating unwanted components from said ion beam;
   a beam transport device for transporting said ion beam through said analyzer at a first transport energy;
   a deceleration stage positioned downstream of said analyzer for decelerating said ion beam from said first transport energy to a final energy lower than said first transport energy for transport without excessive beam expansion;
   a beam filter comprising a magnet positioned downstream of said deceleration stage for separating neutral particles from said ion beam; and a target site for supporting a target for ion implantation, wherein said ion beam is transported through said beam filter and is delivered to said target site at said final energy.

2. An ion implanter as defined in claim 1 wherein said final energy is equal to the ion charge of ions in said ion beam times said first voltage $V_0$.

3. An ion implanter as defined in claim 1 wherein said analyzer comprises an analyzing magnet and a resolving slit, wherein ions of a desired species are deflected by said analyzing magnet so as to pass through said resolving slit.

4. An ion implanter as defined in claim 1 wherein said beam filter comprises an angle corrector magnet for directing ions in said ion beam along substantially parallel trajectories.

5. An ion implanter as defined in claim 1 wherein the ion source comprises an arc chamber and a first power supply for biasing the arc chamber at said first voltage $V_0$.

6. An ion implanter as defined in claim 5 wherein said target site is grounded.

7. An ion implanter as defined in claim 1 wherein said ion source includes means for generating a ribbon-shaped ion beam.

8. An ion implanter as defined in claim 7 further comprising a beam sensing and control assembly for adjusting said ribbon-shaped ion beam to be substantially uniform across its width.

9. An ion implanter as defined in claim 1 further comprising at least one electron generator for supplying electrons to said ion beam.

10. An ion implanter as defined in claim 1 wherein said deceleration stage comprises a deceleration electrode for decelerating ions in said ion bema and a suppression electrode for suppressing flow of electrons in said ion beam from one energy region to another.

11. An ion implanter as defined in claim 10 wherein said deceleration electrode is movable in the direction of transport of said ion beam for adjusting beam focusing properties of said deceleration stage.

12. An ion implanter as defined in claim 10 wherein said deceleration stage focuses said ion beam in a vertical plane for improving beam transmission to the target.

13. An ion implanter as defined in claim 5 wherein said beam transport device comprises a second power supply for biasing components of said analyzer at a second voltage $V_1$ that in part defines said first transport energy.

14. An ion implanter as defined in claim 13 wherein said ion source and said beam transport device are configured such that said first transport energy is equal to $q_i(V_0+V_1)$, where $q_i$ is the ion charge.

15. An ion implanter comprising:
an ion source for generating a low energy, monoenergetic ion beam at a first voltage $V_0$ for delivery to an ion implantation target;
an analyzer for separating unwanted components from said ion beam;
a first beam transport device for transporting said ion beam through said analyzer at a first transport energy;
a first deceleration stage positioned downstream of said analyzer for decelerating said ion beam from said first transport energy to a second transport energy less than said first transport energy without excessive beam expansion;
a beam filter positioned downstream of said first deceleration stage for separating neutral particles from said ion beam;
a second beam transport device for transporting said ion beam through said beam filter at said second transport energy;
a second deceleration stage positioned downstream of said beam filter for decelerating said ion beam from said second transport energy to a final energy less than said second transport energy; and
a target site for supporting a target for ion implantation, wherein said ion beam is delivered to said target site at said final energy.

16. An ion implanter as defined in claim 15 wherein said final energy is equal to the ion charge of ions in said ion beam times said first voltage $V_1$.

17. An ion implanter as defined in claim 15 wherein said analyzer comprises an analyzing magnet and a resolving slit, wherein said analyzing magnet deflects ions of a desired species in said ion beam through said resolving slit.

18. An ion implanter as defined in claim 15 wherein said beam filter comprises a magnet for deflecting ions in said ion beam.

19. An ion implanter as defined in claim 15 wherein said beam filter comprises an angle corrector magnet for deflecting ions in said ion beam along substantially parallel trajectories toward said target site.

20. An ion implanter as defined in claim 15 wherein the ion source comprises an arc chamber and a first power supply for biasing the arc chamber at said first voltage $V_0$.

21. An ion implanter as defined in claim 15 wherein said ion source includes means for generating a ribbon-shaped ion beam.

22. An ion implanter as defined in claim 21 further comprising a beam sensing and control assembly for adjusting said ribbon-shaped ion beam to be substantially uniform across its width.

23. An ion implanter as defined in claim 15 further comprising at least one electron generator for supplying electrons to said ion beam.

24. An ion implanter as defined in claim 15 wherein said first and second deceleration stages each include a deceleration electrode for decelerating ions in said ion beam and a suppression electrode for suppressing flow of electrons in said ion beam form one energy region to another.

25. An ion implanter as defined in claim 24 wherein the deceleration electrode of said first deceleration stage is movable in the direction of transport of said ion beam for adjusting beam focusing properties of said first deceleration stage.

26. An ion implanter as defined in claim 24 wherein said first deceleration stage focuses said ion beam in a vertical plane for improving beam transmission to the target.

27. An ion implanter as defined in claim 20 wherein said first beam transport device comprises a second power supply for biasing components of said analyzer at a second voltage $V_1$ that in part defines said first transport energy.

28. An ion implanter as defined in claim 27 wherein said second beam transport device comprises a third power supply for biasing said beam filter at a third voltage $V_2$ that in part defines said second transport energy.

29. An ion implanter as defined in claim 28 wherein said ion source, said first beam transport device and said second beam transport device are configured such that said first transport energy is equal to $q_i(V_0+V_1)$, where $q_i$ is the ion charge, and said second transport energy is equal to $q_i(V_0+V_2)$.

30. A method for implanting ions in a target, comprising the steps of:
generating a low energy, monoenergetic ion beam at a first voltage $V_0$;
separating unwanted components from said ion beam in an analyzer;
transporting said ion beam through said analyzer at a first transport energy;
decelerating said ion beam from said first transport energy to a final energy lower than said first transport energy downstream of said analyzer without excessive beam expansion;
separating neutral particles from said ion beam in a beam filter comprising a magnet, after decelerating said ion beam from said first transport energy to said final energy; and
delivering said ion beam to a target site at said final energy.

31. A method as defined in claim 30 wherein said final energy is equal to the ion charge of ions in said ion beam times said first voltage $V_0$.

32. A method as defined in claim 30 further comprising the step of suppressing flow of electrons in said ion beam from one energy region to another.

33. A method as defined in claim 30 wherein the step of separating neutral particles from said ion beam comprises deflecting ions in said ion beam along substantially parallel trajectories with an angle corrector magnet.

34. A method as defined in claim 30 wherein the step of transporting said ion beam through the analyzer comprises biasing components of the analyzer at a second voltage that in part defines said first transport energy.

35. A method as defined in claim 30 wherein the step of generating an ion beam comprises generating a ribbon-shaped ion beam and wherein the step of delivering said ion beam to a target site comprises adjusting said ribbon-shaped in beam to be substantially uniform across its width.

36. A method as defined in claim 30 further comprising the step of supplying electrons to said ion beam to limit expansion of said ion beam.

37. A method for implanting ions in a target, comprising the steps of:
generating a low energy, monoenergetic ion beam at a first voltage $V_0$;
separating unwanted components from said ion beam in an analyzer;
transporting said ion beam through said analyzer at a first transport energy;
decelerating said ion beam from said first transport energy to a second transport energy less than said first transport energy in a first deceleration stage positioned downstream of said analyzer without excessive beam expansion;
separating neutral particles from said ion beam in a beam filter positioned downstream of said first deceleration stage;
transporting said ion beam through said beam filter at said second transport energy;
decelerating said ion beam from said second transport energy to a final energy less than said second transport energy in a second deceleration stage positioned downstream of said beam filter; and
delivering said ion beam to a target site at said final energy.

38. A method as defined in claim 37 wherein said final energy is equal to the ion charge of ions in said ion beam times said first voltage $V_0$.

39. A method as defined in claim 37 wherein the step of separating neutral particles from said ion beam comprises deflecting ions in said ion beam with a magnet.

40. A method as defined in claim 37 wherein the step of separating neutral particles from said ion beam comprises deflecting ions in said ion beam along substantially parallel trajectories with an angle corrector magnet.

41. A method as defined in claim 37 wherein the step of transporting said ion beam through the analyzer at a first transport energy comprises biasing components of the analyzer at a second voltage that in part defines said first transport energy.

42. A method as defined in claim 41 wherein the step of transporting said ion beam through said beam filter at said second transport energy comprises biasing said beam filter at a third voltage that in part defines said second transport energy.

43. A method as defined in claim 37 wherein the step of generating an ion beam comprises generating a ribbon-shaped ion beam and wherein the step of delivering said ion beam to a target site comprises adjusting said ribbon-shaped in beam to be substantially uniform across its width.

44. A method as defined in claim 37 further comprising the step of supplying electrons to said ion beam for limiting expansion of said ion beam.

45. An ion implanter comprising:
an ion source for generating a low energy, monoenergetic ion beam and accelerating said ion beam at a first voltage $V_0$;
a beamline module containing one or more beamline components for modifying said ion beam;
means for transporting said ion beam through said beamline module at a first transport energy;
a beam filter positioned downstream of said beamline module for separating neutral particles from said ion beam;
a deceleration stage disposed between said beamline module and said beam filter for decelerating said ion beam from said second transport energy to a final energy less than said first transport energy without excessive beam expansion; and
a target site for mounting a target for ion implantation, wherein said ion beam is transported through said beam filter and is delivered to said target site at said final energy.

46. An ion implanter as defined in claim 45 wherein said means for transporting said ion beam through said beamline module at a first transport energy comprises a power supply for biasing components of said beamline module at a second voltage $V_1$ that in part defines said first transport energy.

47. An ion implanter as defined in claim 46 wherein said beamline module comprises an analyzer for separating unwanted components from said ion beam.

48. An ion implanter as defined in claim 45 wherein said beam filter comprises an angle corrector magnet for directing ion s in said ion beam along substantially parallel trajectories.

49. An ion implanter as defined in claim 45 wherein said deceleration stage comprises a deceleration electrode for decelerating ions in said ion beam and a suppression electrode for suppressing flow of electrons in said ion beam from one energy to another.

50. An ion implanter as defined in claim 45 wherein said ion source comprises means for generating a ribbon-shaped ion beam, said ion implanter further comprising a beam sensing and control assembly for adjusting said ribbon-shaped ion beam to be substantially uniform across its width.

51. An ion implanter as defined in claim 45 further comprising at least one electron generator for supplying electrons to said ion beam for limiting beam expansion.

52. An ion implanter comprising:
an ion source for generating a low energy, monoenergetic ion beam and accelerating said ion beam at a first voltage $V_0$;
an analyzer for separating unwanted components from said ion beam;
a first beamline module containing one or more beamline components for modifying said ion beam;
first means for transporting said ion beam through said first beamline module at a first transport energy;
a second beamline module positioned downstream of said first beamline module, said second beamline module comprising a beam filter for separating neutral particles from said ion beam;
a first deceleration stage disposed between said first and second beamline modules for decelerating said ion beam from said first transport energy to a second transport energy less than said first transport energy without excessive beam expansion;
second means for transporting said ion beam through said second beamline module at said second transport energy;
a target site positioned downstream of said second beamline module for mounting a target for ion implantation; and
a second deceleration stage disposed between said second beamline module and said target site for decelerating said ion beam from said second transport energy to a final energy less than said second transport energy, wherein said ion beam is delivered to the target site at said final energy.

53. An ion implanter as defined in claim 52 wherein said ion source comprises an arc chamber and a first power supply for biasing the arc chamber at said first voltage $V_0$, wherein said first means for transporting said ion beam comprises a second power supply for biasing components of said first beamline module at a second voltage $V_1$ that in part defines said first transport energy and wherein said second means for transporting said ion beam comprises a third power supply for biasing said second beamline module at a third voltage $V_2$ that in part defines said second transport energy.

54. An ion implanter as defined in claim 53 wherein said first beamline module comprises an analyzer for separating unwanted components from said ion beam and wherein said beam filter comprises an angle corrector magnet for directing ions in said ion beam along substantially parallel trajectories.

55. An ion implanter as defined in claim 54 wherein said first and second deceleration stages each include a deceleration electrode for decelerating ions in said ion beam and a suppression electrode for suppressing flow of electrons in said ion beam from one energy region to another.

56. An ion implanter as defined in claim 52 wherein said ion source comprises means for generating a ribbon-shaped ion beam, said ion implanter further comprising a beam sensing and control assembly for adjusting said ribbon-shaped ion beam to be substantially uniform across its width.

57. An ion implanter as defined in claim 52 further comprising at least one electron generator for supplying electrons to said ion beam for limiting beam expansion.

* * * * *